United States Patent [19]
Chambers, IV

[11] Patent Number: 5,577,248
[45] Date of Patent: * Nov. 19, 1996

[54] METHOD AND APPARATUS FOR FINDING LONGEST AND CLOSEST MATCHING STRING IN HISTORY BUFFER PRIOR TO CURRENT STRING

[75] Inventor: Lloyd L. Chambers, IV, Menlo Park, Calif.

[73] Assignee: Salient Software, Inc., Palo Alto, Calif.

[ * ] Notice: The term of this patent shall not extend beyond the expiration date of Pat. No. 5,455,943.

[21] Appl. No.: 468,923

[22] Filed: Jun. 6, 1995

Related U.S. Application Data

[60] Division of Ser. No. 958,008, Oct. 8, 1992, Pat. No. 5,455, 943, which is a continuation-in-part of Ser. No. 840,869, Feb. 25, 1992, Pat. No. 5,481,701, which is a continuation-in-part of Ser. No. 839,958, Feb. 21, 1992, Pat. No. 5,426, 779, which is a continuation-in-part of Ser. No. 759,226, Sep. 13, 1991, Pat. No. 5,155,484.

[51] Int. Cl.⁶ .................................................. G06F 17/30
[52] U.S. Cl. ............................. 395/601; 341/51; 341/106; 364/DIG. 1; 364/260.4; 364/260.6; 395/651; 395/182.13
[58] Field of Search ............................... 395/600; 341/51, 341/67, 106

[56] References Cited

U.S. PATENT DOCUMENTS

| | | | |
|---|---|---|---|
| 4,558,302 | 12/1985 | Welch | 340/347 |
| 4,903,018 | 2/1990 | Wiebach et al. | 341/51 |
| 4,988,998 | 1/1991 | O'Brian | 341/55 |
| 5,016,009 | 5/1991 | Whiting et al. | 341/67 |
| 5,049,881 | 9/1991 | Gisbon et al. | 341/95 |
| 5,051,745 | 9/1991 | Katz | 341/51 |
| 5,146,221 | 9/1992 | Whiting et al. | 341/67 |
| 5,146,560 | 9/1992 | Goldberg et al. | 395/200 |
| 5,150,119 | 9/1992 | Yoshida et al. | 341/51 |
| 5,150,430 | 9/1992 | Chu | 382/56 |
| 5,153,591 | 10/1992 | Clark | 341/51 |
| 5,179,378 | 1/1993 | Ranganathan et al. | 341/51 |
| 5,228,133 | 7/1993 | Oppedahl | 395/425 |
| 5,243,341 | 9/1993 | Seroussi et al. | 341/51 |
| 5,253,325 | 10/1993 | Clark | 395/2 |
| 5,298,895 | 3/1994 | Van Maren | 341/51 |
| 5,353,024 | 10/1994 | Graybill | 341/51 |

*Primary Examiner*—Thomas G. Black
*Assistant Examiner*—Wayne Amsbury
*Attorney, Agent, or Firm*—Fliesler, Dubb, Meyer & Lovejoy

[57] ABSTRACT

The invention provides a method and apparatus for finding a longest and closest matching string in a history buffer prior to a current string. A search algorithm in accordance with the invention first tries to find the longest matching old string (MOS) in the history buffer as its major task, and in a case where two MOS's are found to have the same longest matching length, the search algorithm tries to select the MOS closest to the current position as its minor task. Linked lists are constructed as searching progresses to speed the search process. The linked lists define a fast-path array which points to all locations within the history buffer containing a specified code sequence. Pointers to locations outside the history buffer are optionally removed and their space returned to memory free space.

8 Claims, 1 Drawing Sheet

METHOD AND APPARATUS FOR FINDING LONGEST AND CLOSEST MATCHING STRING IN HISTORY BUFFER PRIOR TO CURRENT STRING

This application is a division of Ser. No. 07/958,008, filed Oct. 8, 1992, now U.S. Pat. No. 5,455,943 which is a continuation-in-part of Ser. No. 07/840,869, filed Feb. 25, 1992, now U.S. Pat. No. 5,481,701 which is a continuation-in-part of Ser. No. 07/839,958, filed Feb. 21, 1992, now U.S. Pat. No. 5,426,779 which is a continuation-in-part of Ser. No. 07/759,226, filed Sep. 13, 1991 now U.S. Pat. No. 5,155,484.

BACKGROUND

1. Field of the Invention

The invention relates generally to computer-automated string matching. The invention relates more specifically to string matching applied in the context of a data compression method.

2a. Notice Regarding Copyright Claim to Disclosed Computer Program Listing

This application includes a listing of a computer program.

The assignee of the present application claims certain copyrights in said computer program listing. The assignee has no objection, however, to the reproduction by others of this listing if such reproduction is for the sole purpose of studying it to understand the invention. The assignee reserves all other copyrights in the program listing including the right to reproduce the computer program in machine-executable form.

2b. Cross Reference to Related Applications

The following U.S. patent application(s) is/are assigned to the assignee of the present application, is/are related to the present application and its/their disclosures is/are incorporated herein by reference:

(A) Ser. No. 07/759,226 filed Sep. 13, 1991, by Lloyd L. Chambers IV and entitled FAST DATA COMPRESSOR WITH DIRECT LOOKUP TABLE INDEXING INTO HISTORY BUFFER, now U.S. Pat. No. 5,155,484; and (B) Ser. No. 07/839,958 filed Feb. 21, 1992, by Lloyd L. Chambers IV and entitled METHOD AND APPARATUS FOR LOCATING LONGEST PRIOR TARGET STRING MATCHING CURRENT STRING IN BUFFER, now U.S. Pat. No. 5,246,779.

3. Description of the Related Art

It is sometimes advantageous to scan through a "history" buffer of a digital computer to find an "old data string" within the buffer which matches the starting and subsequent portions of a current data string to the longest extent possible.

The above-cited U.S. patent application Ser. No. 07/839,958, METHOD AND APPARATUS FOR LOCATING LONGEST PRIOR TARGET STRING MATCHING CURRENT STRING IN BUFFER, now U.S. Pat. No. 5,246,779 is an example of one useful application of such string matching. A data compression system tries to replace each successive "current" data string (a set of adjacent bytes or bits) within an input buffer with a "compression vector" of shorter bit length.

The compression vector points back into a history buffer portion of an input buffer, to a matching old string (hereafter also termed "MOS"). The MOS is the same as the current string for a given number of bits or bytes. The compression vector indicates the length of match between the current string and the matching old string (MOS). During decompression, the history buffer is reconstructed from the compressed file, in a sequential, front-to-end boot-strap fashion, with each encountered "compression vector" being replaced by the indicated length of a prior string in the partially-reconstructed history buffer, the prior string being one that is pointed to by the vector.

Compression efficiency depends on the length of match between each current string and a prior string and on the length of the vector that replaces the current string. Ideally, the compression vector should be as small as possible and the match length should be as large as possible.

Theoretically speaking, a wide variety of algorithms could be employed to realize such an ideal condition. However, in practice, attention has to be paid to physical considerations such as limiting compression time, limiting decompression time, and avoiding excessive waste of system memory space during compression and/or decompression.

The system disclosed in the above-cited U.S. patent application Ser. No. 07/839,958, METHOD AND APPARATUS FOR LOCATING LONGEST PRIOR TARGET STRING MATCHING CURRENT STRING IN BUFFER, now U.S. Pat. No. 5,246,779, searches a history buffer from a front end to back end, looking first for all possible matches to a current string and then for the longest match.

In so doing, the system first generates an array of sorted "index-pair" lists to help it find matching strings more quickly. Each index-pair list is associated with one of $2^{16}$ possible two-byte combinations. There are thus, as many as $2^{16}$ such lists created within the computer's memory. The first two bytes of the current string are combined to produce a reference "index-pair". Each matching two-byte combination within the history buffer is considered the start of an old string which matches the current string for at least two bytes. Examples of "index-pairs" include ASCII combinations such as "AB", "AN", "BU", etc.

Each sorted index-pair list includes one or more pointers that point to the locations of one or more matching index-pairs in the history buffer. Sorting of lists and entries within the array is done first according to index-pair value and next, within each list, according to the position of the index-pair within the history buffer, with the position of the matching index-pair furthest away from a "current" string position appearing first in its corresponding list. The system then uses the sorted index-pairs array as a fast path for locating every old string which starts with the same index-pair as the first two bytes of the current string (the string which is to be potentially replaced with a compression vector).

When the longest old string is found that matches a corresponding length of the current string, a compression vector is generated. The compression vector includes an n-bit-long offset-value field which indicates the difference between the start position of the current string and the start position of the matching old string (MOS). The compression vector further includes an m-bit-long length-value field which indicates the number of successively matching bytes in the old string.

Other fields may also be included within the compression vector, but of importance here, it is to be noted that the length of the compression vector is at minimum, n plus m bits (the length of the offset-value field plus the length of the length-value field). Compression efficiency suffers when the sum n+m remains relatively large over a large number of compression vectors.

SUMMARY OF THE INVENTION

The invention provides a method and apparatus for finding the longest and closest old string within a history buffer that matches a corresponding length of a current string.

When applied to history-buffer style compression algorithms, the invention helps to reduce the bit-length of generated compression vectors. The advantage of finding the closest matching string is that the bit-length, n, of the offset-value field (the group of bits that represent the difference between the start position of the current string and the start position of the matching old string) can then be minimized. This leads to smaller compression vectors, more compactly compressed output files, and faster decompression times.

An apparatus in accordance with the invention comprises: (a) memory means for storing data; and (b) a processing unit operatively coupled to the memory means; wherein the memory means stores history data composed of one or more data strings, fast-path data pointing to the location within the memory means of one or more data strings, if any, which contain a prespecified sequence of code and, in cases where more than one of the pointed-to data strings has the same prespecified sequence of code, the data in the memory means further indicates the order in which the more than one pointed-to data strings appear within the memory means relative to a specified current location.

A method in accordance with the invention comprises the steps of: (a) storing a plurality of data strings within memory; (b) identifying one or more of the data strings that contain a prespecified code sequence; and (c) in cases where more than one of the identified data strings has the same prespecified sequence of code, indicating the order in which the more than one identified data strings appear within the memory relative to a reference location.

BRIEF DESCRIPTION OF THE DRAWINGS

The below detailed description makes reference to the accompanying drawings, in which.

DETAILED DESCRIPTION

Figure 1:
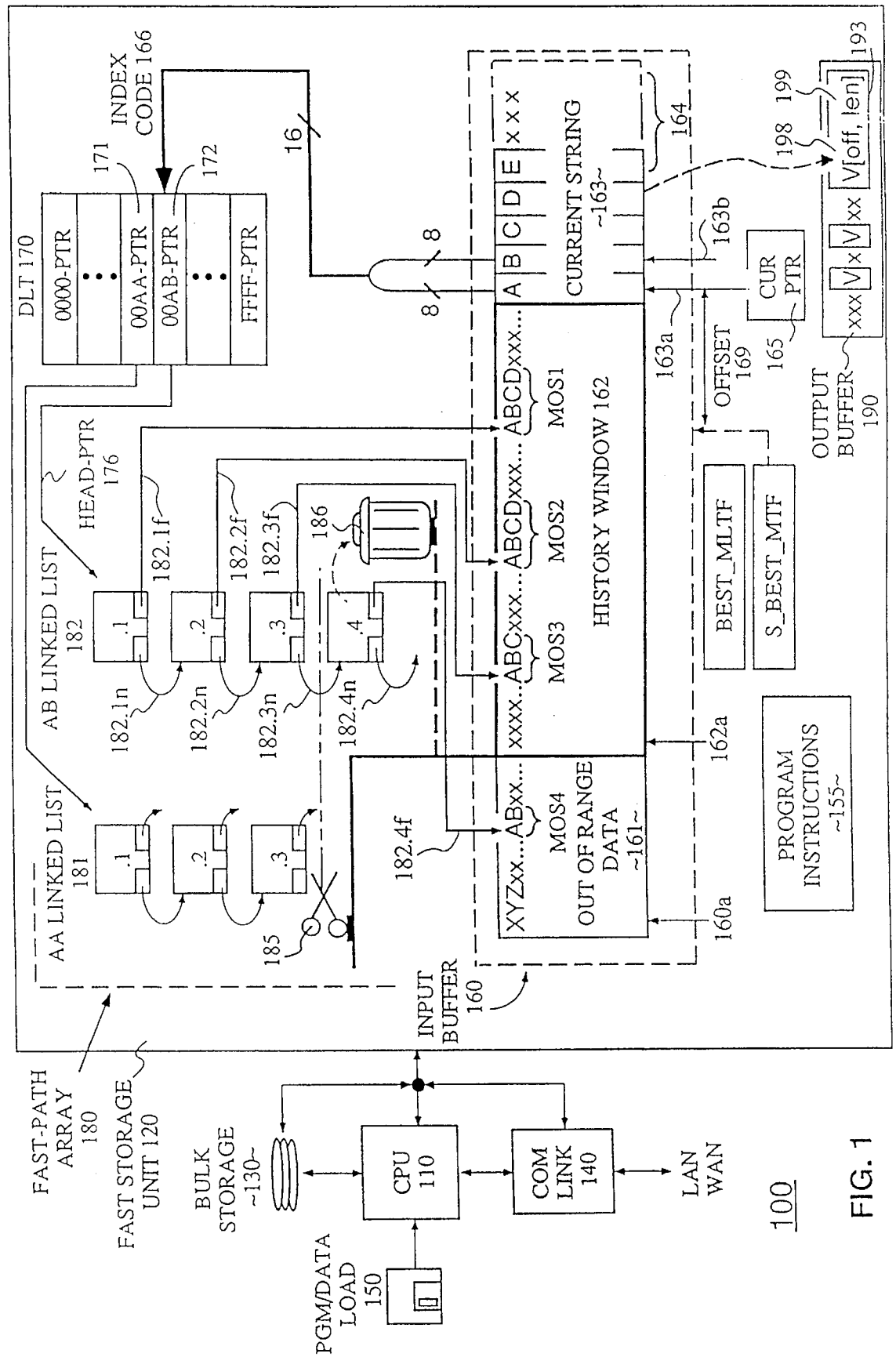
FIG. 1 is a block diagram of a computer system 100 in accordance with the invention.

The basic principle behind history-buffer based compression and decompression can be quickly appreciated by considering the example given in below Table 1.

type indicators and special case length indicators. Literal data are shown as regular ASCII characters, while vectors are shown enclosed in square brackets. For example, the notation [−4,3] indicates a compression vector with an offset-value equal to four (meaning that the absolute address of the matching prior string is minus four added to the current location) and a length of three.

As long as each compression vector, e.g. [−4,3], consumes fewer bits than the non-compressed text (e.g. "AT_") that it replaces, the compressed file occupies less memory space than the original non-compressed file. The problem then becomes one of maximizing compression efficiency while complying with practical considerations such as limiting compression and decompression time and avoiding excessive waste of system memory space during compression and/or decompression.

It has been found, through experience, that searches through the history buffer often produce two or more matching old strings each having the same, longest length of match to a given current string. The system disclosed in the above-cited U.S. patent application Ser. No. 07/839,958, METHOD AND APPARATUS FOR LOCATING LONGEST PRIOR TARGET STRING MATCHING CURRENT STRING IN BUFFER, now U.S. Pat. No. 5,246,779, tended to pick the longest matching old string that was furthest away in position from the current string. As a result, the bit-length, n, of the offset-value field in each compression vector (the group of bits in each compression vector that represent the difference between the start position of the current string and the start position of the matching old string) tended towards a maximum rather than a minimum.

The system disclosed in the above-cited U.S. patent application Ser. No. 07/839,958, now U.S. Pat. No. 5,246,779 also had another drawback. It tried to pre-sort all of $2^{16}$ possible list combinations for index-pairs in the old text (in the history buffer) before it was known whether all of the $2^{16}$ corresponding two-byte combinations would actually appear in the new text (the current and future strings which are to be compressed). This sometimes resulted in a waste of computational resources and time.

In accordance with the present invention, so-called "fast-path lists" are built up over time as each new string becomes the current string, and each list is sorted, ordered, or otherwise organized to indicate the ordering of each set of potentially-matching old strings relative to the location of a current string.

FIG. 1 is a block diagram of a computer system 100 in accordance with the invention.

TABLE 1

Non-Compressed Data

THE_CAT_SAT_IN_A_SATIN_HAT_THAT_A_A_MAN_CANNOT_WEAR.

Symbolic Compressed Data

THE_CAT_S [−4,3] IN_A [−9,4] [−8,3] H [−15,3]
[−27,2] [−5,3] [−17,2] MA [−23,2] [−34,2] NNO
[−37,2] WEAR.

Actual Compressed Data (Hexadecimal format)

2A12$_H$ 08A5$_H$ F219$_H$ 04A8$_H$ 5F29$_H$ C090$_H$ 924E$_H$
2F90$_H$ 609B$_H$ 0442$_H$ 441F$_H$ 21B4$_H$ 0B21$_H$ 1134$_H$
830B$_H$ A221$_H$ 389C$_H$ 4F89$_H$ 4572$_H$ 2904$_H$ A42E$_H$

In the symbolic compressed data of Table 1, literal and vector indicating headers are omitted, as are offset length- Computer system 100 includes a local or central processing unit (CPU) 110 operatively coupled to a high-speed memory unit 120 (e.g. a unit comprised of dynamic random access memory devices (DRAM's) and/or static random access memory devices (SRAM's)). CPU 110 responds to instructions stored within the memory unit 120 and/or modifies data within the memory unit 120 in accordance with instructions provided to the CPU 110. The instructions are conveyed to CPU 110 as electrical, optical or other signals.

System 100 further includes a bulk storage unit 130 (e.g., a magnetic disk bank) which is operatively coupled to the CPU 110 and/or memory unit 120 for transferring data between the slower bulk storage unit 130 and the faster memory unit 120 as needed.

System 100 also includes a communications link 140, operatively coupled to the CPU 110 and/or the fast-memory unit 120, for exchanging data between system 100 and other systems (not shown) over a local area network (LAN) or a wide area network (WAN) or other communications media.

A program/data loading means 150 such as a floppy disk drive or a tape drive or a ROM cartridge reader is provided to load program instructions 155 and/or other data from a removably-insertable transfer media such as a magnetically-encoded floppy disk or an optically-encoded disk (e.g. CD-ROM) or a magnetic tape or a ROM (read-only memory) cartridge into system 100 for storage within one or both of the fast-memory unit 120 and the bulk-storage unit 130. Alternatively, the program instructions 155 and/or other data may be down-loaded into system 100 by way of the communications link 140. The program instructions 155 are used for controlling operations of the CPU 110.

A pre-loaded set of program instructions are represented as occupying a first region 155 of the memory space within fast-memory unit 120.

Another region 160 of the memory space within fast-memory unit 120 holds part or all of a source data file that is to be compressed to form a compressed output file that will be stored in yet another region of memory, referred to as the output buffer 190. After compression completes, the data in output buffer 190 is transferred out of memory unit 120 for storage in the bulk storage unit 130 and/or for storage in a removable media (e.g., floppy disk) within the program/data loading means 150 and/or for transmittal over a communications network by way of link 140.

Region 160 is referred to as an input data buffer 160. This input data buffer 160 is subdivided into four successive regions, respectively referred to as an out-of-range region 161, a history window 162, a current string 163 and a future-strings region 164.

Current string 163 comprises a plurality of two or more successive bytes which are to be replaced, if possible, by a compression vector 193 having a bit length shorter than current string 163. The compression vector 193 is stored in the output buffer 190 while the current string 163 remains as is within the input data buffer 160. In one embodiment, the current string 163 is limited to a maximum length of 20 bytes so that a length code field 199 within the compression vector 193 can be limited to 5 or less bits.

A current pointer, CUR 165, points to the first byte 163*a* of current string 163. The value CUR+1 references the second byte 163*b* of the current string 163. Current pointer 165 is defined in whole or in part by data stored in one or both of the memory unit 120 and internal registers (not shown) of CPU 110. FIG. 1 shows the current pointer 165 as data contained within the memory unit 120.

For the sake of simplicity, it is assumed here that the first byte 163*a* of current string 163 contains ASCII code representing the capital letter "A", the second byte 163*b* contains code representing "B", the third byte contains code representing "C", and so forth. It is to be understood that, in practice, any 8-bit-long code may be stored in each successive byte of current string 163.

In accordance with a data compression or other algorithm being performed, it is desirable to find all strings within history window 162 which begin with the same starting sequence, AB, as does current string 163. Data within the out-of-range region 161 is considered too far away from the current (CUR) position and is not searched.

A brute force approach would scan sequentially across successive bytes of history window 162, looking for pairs matching those held in memory locations CUR and CUR+1. This might be acceptable if only one current string 163 is to be compressed, but in cases where the procedure is to be repeated for the next string in future region 164, and then the next string, and so on, it is preferable to use a faster means for locating every AB matching pair within history window 162.

In accordance with the invention, the codes in the first and second bytes of current string 163 are combined to form a 16-bit long "index-pair" code 166 (e.g. "AB"). A data look-up table (DLT) 170 is provided for converting any given index-pair code 166 into a corresponding top-of-list pointer 176. There are $2^{16}$ possible index-pair codes, and accordingly, the DLT 170 contains a corresponding number ($2^{16}$) of entries. These entries are symbolized in FIG. 1, using hexadecimal format, as: 0000-PTR, 0001-PTR, 0002-PTR, . . . , 00AA-PTR, 00AB-PTR, 00AC-PTR, . . . , FFFD-PTR, FFFE-PTR, FFFF-PTR.

Each DLT entry, 0000-PTR through FFFF-PTR, is generically denoted here as an "XY-PTR" and is understood to be accessed from the Data Look-up Table 170 by its corresponding index-pair code, "XY". (If DLT 170 were to be implemented as a hardware device, it would be a RAM or similar device receiving the index-pair code 166 as an input address and producing the XY-PTR as its output.) Each such DLT entry (XY-PTR), if not otherwise coded, points to a top-of-list position in another array, 180, which is organized to contain a corresponding number (e.g., as many as $2^{16}$) of lists. If a particular list does not exist in array 180, the corresponding XY-PTR entry of DLT 170 is preferably coded to indicate that the corresponding list does not exist in array 180.

Two specific ones of the $2^{16}$ DLT entries are referred to here as the AA-pointer 171 and the AB-pointer 172, and these are respectively referenced by the index-pair codes, "AA" and "AB". (For the purpose of explanation it makes no difference whether AA and AB are thought of here as representing successive ASCII codes each stored in a separate byte or successive hexadecimal codes such as $00AA_H$ or $00AB_H$ stored in respective first and second bytes. The latter format is used in FIG. 1 to indicate that there are $2^{16}$ entries in DLT 170. The former format is used here so that the contents of byte 163*a* can be simply referenced as "A", the contents of byte 163*b* can be simply referenced as "B" and the combination can be simply referenced as "AB".)

Array 180 is referred to as the "fast-path array" (or FP_array for short) because it is used to quickly point to each string within the history window 162 that starts with a given index-pair code 166 (e.g., AA or AB). As already mentioned, the fast-path array 180 can contain a number (e.g. $2^{16}$) of lists equal to the corresponding number of head-of-list pointers in the DLT 170.

For the sake of illustrative brevity, FIG. 1 shows only two such lists, 181 and 182, and they are respectively referred to as the AA linked-list 181 and the AB linked-list 182. The AA-pointer 171 points to a head record 181.1 of the AA linked-list 181, while the AB-pointer 172 points to a head record 182.1 of the AB linked-list 182.

Referring to the AB linked-list 182 shown in FIG. 1, it is seen that it is composed of plural records, 181.1, 181.2, 181.3, etc. Each record 182.x (x represents an arbitrary integer here) includes a next-record pointer 182.xn and a fast-path pointer 182.xf. The next-record pointer 182.xn either points to a next record within list 182 or indicates the end of list with a code such as $FFFF_H$ in the case where there is no next record. The fast-path pointer 182.xf either points to an old data string within history window 162 that starts with the corresponding two-byte combination, "AB" or indicates that no such matching pair exists. It is understood that the other lists 181, etc. of fast-path array 180 are organized in similar fashion to that described for the AB linked-list 182.

Of importance, the fast-path pointer 182.1f of head record 182.1 points to the start of a matching old string MOS1 (one that starts with the two-byte sequence "AB") located closest to the current pointer CUR, the fast-path pointer 182.2f of next record 182.2 points to the start of a matching old string MOS2 located next closest to the current pointer CUR, and so forth.

In other words, list 182 contains information identifying each old data string within history window 162 that starts with the "AB" sequence and it also contains information that indicates the relative distance or order of placement of each such old data string MOSx with respect to the current string 163. The embodiment shown in FIG. 1 uses a linked list structure for indicating the relative distance between each such old data string MOSx and the current string 163. Those skilled in the art will recognize that other data structures may be employed to perform an equivalent function. The invention is not limited to the use of linked lists.

The advantage of linked lists, however, is that each list 181, 182, etc., can be built over time to only point at two-byte combinations that are known to exist within history window 162. Memory space and/or processor resources are not wasted on two-byte combinations that do not exist within history window 162.

At the start of operations, CPU 110 resets the current pointer 165 to point to the start 160a of input data buffer 160. Fast-path array 180 is empty. DLT 170 is filled with a series of $2^{16}$ nill pointers, each indicating that there is no corresponding list yet constructed in the fast-path array 180. (It is to be understood that program instructions 155 direct the CPU 110 to initialize the memory unit 120 into such a state and that they further direct the CPU 110 to rearrange data within memory unit 120 in accordance with the following description.)

Input data buffer 160 does not yet contain an out-of-range data region 161 or a history window 162 at this time. An index-pair code 166 is formed from the first and second bytes in input data buffer 160. If the first two bytes are represented by the code pair, XY, the corresponding entry XY-PTR is read from the DLT 170 and the corresponding head record 18XY.1 (not shown) is found in the fast-path array 180 if such a head record exists. Regardless of whether a pre-existing head record exists or not, a new record is now created at or as the head position of the corresponding XY-associated list, 18XY (e.g., 181, 182, etc.). The new record now takes on the head-record name, 18XY.1 while the record that was previously the head record, if there was such a record, takes on the second place name, 18XY.2. The XY-PTR entry in the DLT 170 is adjusted to point to the new head record. The next-record pointer 18XY.1n of the new head record is set to point to what was previously the head record, if any, or otherwise to indicate there is no next record. (This is referred to as a linked-list INSERT in some list-processing systems.) The fast-path pointer 18XY.1f of the new head record is filled with a pointer pointing back to the "X" byte in the first position 160a of input data buffer 160. The just-described step of inserting a new head record into a list 18XY is referred to below as "posting".

The current pointer 165 is advanced to point to the next location in input data buffer 160. Say the next index-pair code 166 is "YZ", the first byte "Y" having served as the second byte of the previous pair, "XY". The above-described process repeats so as to post the starting location of the "YZ" pair code into the fast-path array 180.

The current pointer 165 is now advanced a third time, to point to the next location in input data buffer 160. Say the next index-pair code 166 is "Zx", the first byte "Z" having served as the second byte of the previous pair, "YZ", and the lower case "x" representing another byte. At this time, history window 162 will have come into existence, with the first-encountered byte-pair "XY" defining an old data string within window 162. A test is performed to see if the current string "Zx" has a match in the history window 162. Regardless of the outcome of the match-finding test, the post-to-FP_array process repeats again so as to post the starting location of the "Zx" index-pair code into the fast-path array 180.

As the current pointer 165 advances again and again, every byte-pair in a newly encounter "current string" has its location posted to the fast-path array 180, thereby building the fast-pointers of array 180 on the fly, as they become useful for assisting in a subsequent match finding operation. This means that the fast-path array 180 does not have to consume more space out of system memory free-space than what is known to be of use in assisting with each successive match-finding operation.

By the time the post-to-FP_array process reaches the state shown in FIG. 1, the out-of-range data region 161 will have come into existence. The current pointer 165 is now advanced so far away from the starting position 160a of input data buffer 160 that it is no longer worthwhile or possible to search for matching old strings in the address space between starting position 160a and the start 162a of the history window 162. A garbage collecting mechanism 186 can now be optionally invoked to search tail ends of lists within the fast-path array 180 for records with fast-path pointers 18XY.zf (z indicates here that it is a tail end record in list 18XY) pointing to the out-of-range data region 161. If free memory space is in short supply, the garbage collecting mechanism 186 can cut off such non-useful tail records, return them to the system memory free space and adjust the next-record pointer at the end of each clipped list to indicate there is no longer a next record.

In one particular embodiment, the history window 162 is assigned a maximum length of 4 Kilo-bytes (4 KB) so that no more than 12 bits will be required to specify an offset 169 between any given byte of history window 162 and the "current" position 163a pointed to by the current pointer 165. The XY-PTR entries of the DLT 170, on the other hand, are each 16 bits or longer so they can each point to a unique one of the 216 possible lists of fast-path array 180.

It will be assumed here that, for the state shown in FIG. 1, four strings each containing the starting sequence "AB" have already been found in the input data buffer 160 and their positions have been posted into fast-path array 180 according to the order in which they were encountered. Current string 163 is shown to start with the code sequence "ABCDExxxx", the x positions being ones containing unmatchable bytes. The four, already-posted, old strings with matching start sequences are represented as "ABxxx . . .", "ABCxxx . . .", "ABCDxxx . . .", and "ABCDxxx . . .". The matching portions of these strings are referenced respectively as MOS4, MOS3, MOS2 and MOS1. The last mentioned matching old string, MOS1, is closest to the current position 163a and has a match length equal to four. MOS2 is second closest to the current position and also has a match length equal to four. MOS3 is third closest to the current position and has a match length equal to three. MOS4 is furthest from the current position and has a match length equal to two. Matching old string MOS4 is in fact so far away from the start 163a of the current string that MOS4 falls into the out-of-range data region 161.

The following steps are performed by CPU 110 to create a compression vector 193 in output buffer 190, as a substitute for current string 163.

The two bytes respectively at CUR position 163a and CUR+1 position 163b are combined to form a 16-bit long index code 166. In the illustrated example, index code 166 points to entry 00AB-PTR 172 of the Data Look-up Table 170. The 00AB-PTR entry 172 points to the head record 182.1 of the AB linked list 182. The fast-path pointer 182.1f of the head record points to the starting position of matching old string MOS1.

A comparison is made between the third and subsequent bytes of current string 163 against the third and subsequent bytes of MOS1. (It is already known that the first and second bytes match.) In the illustrated example, it is discovered that the total match length between MOS1 and current string 163 is equal to four. This match length is recorded (within memory unit 120 or elsewhere) as the longest (best) match length thus far (BEST_MLTF). The position 182.1f of MOS1 is recorded as the start of the longest (best) match found thus far (S_BEST_MTF).

Next-record pointer 182.1n is then used to access the next-record 182.2 in the AB linked list 182. Using fast-path pointer 182.2f as the reference to the first two bytes of MOS2, a comparison is carried out between the third and subsequent bytes of MOS2 against the third and subsequent bytes of current string 163. In the illustrated case, the total match length is again found to be four. If the new match length is not greater than the previously recorded largest-match-length thus-far (BEST_MLTF), the previously recorded reference (S_BEST_MTF) to MOS1 is kept as representing the longest MOS found thus far. Otherwise, if the most recently tested MOS is found to be longer, the previously recorded reference to MOS1 is replaced by a reference to the start of the newly-discovered longer MOS.

Because MOS1 has the same match length as MOS2 in the illustrated case, the reference (S_BEST_MTF) to MOS1 as the longest (best) match found thus far is kept.

Put in other words, the search algorithm first tries to find the longest matching old string (MOS) as its major task, and in a case where two MOS's are found to have the same longest matching length, the search algorithm tries to select the MOS closest to the current position 163a as its minor task.

The matching old string MOS3 which is pointed to by next record 182.3 is subsequently investigated and found to have a total matching length less than that of the longest matching length recorded thus far (BEST_MLTF). Pointer S_BEST_MTF is therefore left unchanged and it continues to point to MOS1 as the longest and closest matching old string found thus far.

Although not mentioned yet, when each of fast-path pointers 182.1f, 182.2f, 182.3f, etc., is fetched, a test is conducted to see if the fast-path pointer points to a location preceding the start 162a of history window 162. If the answer is yes, as it will be in the case when fast-path pointer 182.4f is investigated, the search-for-longest/closest MOS is terminated. The preceding next-record pointer 182.3n is preferably altered at this time to indicate that there is no further record in the AB linked list 182 and to thereby make record 182.3 the last record of list 182.

The process wherein next-record pointer 182.3n is clipped is represented by scissors icon 185. Scissors icon 185 is suggestively drawn in FIG. 1 as being supported on a platform that moves with the start position 162a of history window 162. This is done to indicate that this list-terminating process operates in conjunction with the advancement of current pointer 165. Each time it is discovered that a linked list has tail records pointing behind the forward moving start 162a of history window 162, those tails records are trimmed away so that they will not waste time for next-performed searches. Garbage collecting mechanism 186 (represented by a garbage can icon) is optionally invoked at the same, or more preferably at a later time when a shortage of free memory space is detected, to recover memory space that was previously consumed by the clipped-off tail end (e.g. 182.4 and its next records) of the AB linked list 182.

The longest and closest matching old string, MOS1, is subsequently used to generate compression vector 193. The offset 169 between current position 163a and the start position defined by S_BEST_MTF (which points to MOS1 in the illustrated example) is the smallest offset that can be generated for all matching old strings within history window 162 that satisfy the condition of having the longest match length. The number of bits required for recording an corresponding offset code field 198 within vector 193 can be minimized as a consequence.

Many coding techniques can be used for advantageously representing offset 169 with an offset code field 198 having a relatively small number of bits. In one particular embodiment of the invention, compression vector 193 includes an offset-type indicating bit (not shown) which indicates the offset code field 198 to be either eight bits long or twelve bits long. If offset 169 can be specified in eight or less bits, the offset-type indicator is switched to indicate the shorter type of offset field 198 and the overlength of vector 193 is reduced by four bits as a consequence.

While this may not seem significant of itself, it is to be understood that output buffer 190 may include hundreds or thousands of such compression vectors (indicated by boxed V symbols) and a saving of just four bits for each compression vector can result in a saving of hundreds or thousands of bytes in the resulting compressed output file. It then takes less time to store the compressed output file to bulk storage 130 (e.g. a disk bank) and/or transmit it over communications link 140 and to thereafter retrieve the compressed file from bulk storage 133 or from communications link 140. As a result, overall compression-plus-store and retrieve-plus-decompression times are advantageously reduced.

After compression vector 193 is generated, the algorithm posts each of the two-byte combinations within the matched current string 163 plus the last byte ("D") of matched string 163 and the next byte ("E") to the fast-path array 180. In other words, it posts index pairs: AB, BC, CD, and DE to the fast-path array 180 thereby incorporating all index pairs of use for a next best-match operation into the FP_array 180. This, in essence, advances the history window 162 to encompass string 163. Current pointer 165 then advances to point to the beginning of the new current string 164, which in FIG. 2 begins with the sequence "Exxx". The above described process of searching for the longest and closest match is then repeated for this new "current" string 164. It has been found that many to-be-compressed files have a large number of often-repeated code strings, that the repeated code strings tend to be placed closely together, and that match length between repeated code strings tends to be inversely proportional to the address interval separating the code strings. Accordingly, the above-described method provides very efficient compression when it encounters a to-be-compressed file with such characteristics. In comparing the system of above-cited U.S. patent application Ser. No. 07/839,958, METHOD AND APPARATUS FOR LOCATING LONGEST PRIOR TARGET STRING MATCHING CURRENT STRING IN BUFFER, now U.S. Pat. No. 5,246,779, against a system in accordance with the present invention, it has been found that the present invention generally provides a two-to-one improvement in compression speed. Part of the reason is that the compression vectors tend to be more compact, compressed files are smaller as a result, and storage/retrieval times for the compressed files are significantly reduced.

The disclosed method and apparatus for finding the longest and closest matching data string is not limited in application to data compression. It can find use in other environments, such as text analysis for example. It may be desirable to analyze a body of text to determine characteristics such as repetition of a same word or phrase and distances between repetitions of the string. The system 100 of FIG. 1 can be used to perform this function.

Those skilled in the art will recognize that many variations are possible for the data processing scheme described above. A computer listing is provided below as one example of how the scheme may be implemented. The below computer listing is written primarily using the ANSI version of the C language with some modules written in the assembly language of the Motorola 68000™ microprocessor family. Some modules include compile-time switches that are used to take advantage of certain members of the 68000 family (e.g. Motorola 68020™, 68030™, or higher) when one of the higher-numbered processors is available within the system. The object code which is derived from compilation of the below source code is intended for use in Apple Macintosh™ computers and the like. The ThinkC™ compiler available from Symantec of California can be used to convert the below source code into executable object code.

In the below listing, the object "PairInfo" represents a linked list record such as one of the above-described records 182.1, 182.2, etc. The routine "PairsSortInitSizeCompression" allocates memory space for creating the fast-path array (PairsArray) and the data look-up table 170. The routine ClearDLT initializes the data look-up table 170. The routine MatchBestPair finds the matching old string with the best length and best offset in accordance with the invention. The routine PairsSortCompressBlock generates the compression vectors. Note that there is a maximum match length allowed for each compression vector.

Computer Program Listing

```
/*
**
**      (C) Copyright 1992
**      FIFTH GENERATION SYSTEMS, INC.
**      Baton Rouge, Louisiana
**
**      All rights except those expressly
**      waived above are reserved.
**
**      Written by Lloyd L. Chambers
*/ define USE_ASM        /* define this if using 68000/68020 assembly code in places */ typedef unsigned short    ushort;
typedef unsigned long     ulong;
typedef unsigned char     uchar;

#define NIL              ((void *)0L)

/*
** maximum amount of extra data output when data is corrupted.
** This is essentially the longest possible string.
*/
#define PAIRS_MAX_LENGTH     ( 20 )
#define PAIRS_MAX_OVERWRITE  ( PAIRS_MAX_LENGTH + 1 )

typedef ushort   PairsOffsetType;
#define PAIRS_MAX_STREAM     (65535L - PAIRS_MAX_LENGTH - 1)

/*
** The header that precedes compressed data.
** 'expSize' is only field really needed; other fields are for programmer
** convenience or as needed by whatever program is using the compressor.
*/
typedef struct
{
        PairsOffsetType       compSize;
        PairsOffsetType       expSize;
        ulong                 futureUse;
        uchar    compDataChecksum;
        uchar    reserved          : 2;
        uchar    repaired          : 1;
        uchar    compressorUsed    : 2;
        uchar    compSizePad       : 2;
```

```
        uchar   copied              : 1;
        uchar   expDataChecksum;
        uchar   headerChecksum;
} PairsBlockHeader;

#define PAIRS_HISTORY_BITS            (12)
#define PAIRS_HISTORY_LENGTH(1 << PAIRS_HISTORY_BITS)

#define PAIRS_MAX_BLOCK_SIZE (8192L)

/*
** number of additional bits we use for long strings
** CAUTION!!!: a loop is unrolled in the code that depends on MAX_MATCH.
** If you change MAX_MATCH, search for Unroll, and make sure there are
** MAX_MATCH -2 Unrolls.
*/
#define MAX_MATCH_BITS      4
/* MAX_MATCH should be 5 + (2^MAX_MATCH_BITS)-1 */
/* maximum length string we can match */
/* CAUTION: this value is assumed in expansion assembly code! */
#define MAX_MATCH           20

/*
** For negative offsets from current, how many bits worth?
** e.g 8 is for up to 255 backwards.
*/
#define BACK_BITS           8
/* maximum amount we can go backwards */
#define BACK_BITS_MAX ((1 << BACK_BITS) - 1)
define usedPairsSortCompressor 1 void    *AllocatePtr( long size);       /* OS routine to allocate memory */
void    FreePtr( void *);               /* OS routine to free memory */ static void
Nullify(
        register uchar    *ptr,
        register ulong    count)
{
        while ( count-- > 0)
                *ptr++ = 0;
} define MOVEPAIR            move.w
define CMPPAIR             cmp.w
define PAIR_SIZE_BITS  2   /* 4 */ typedef PairsOffsetType   OffsetType;
typedef struct
{
        OffsetType    offset;
        OffsetType    nextIndex;
} PairInfo;

/* CAUTION: INVALID must be correct size or compiler generates wrong code */
#define INVALID         ((OffsetType)(~0))
#define INVALID_LONG    (~0L)

/* an array of the pairs, sorted in ascending order */
static PairInfo             *PairsArray;
/*
```

```
** an DLT of 64K entries,
** each of which points to the first occurence of the index in 'PairsArray'
*/
static OffsetType  *DLT;

static OSErr
PairsSortInitSizeCompression(ulong inputLength)
{
        if ( PairsArray == NIL )
        {
           ulong maxPairs;

/* we actually need space for as many as we might create, based on vector
        running off end */
                maxPairs        = ((ulong)inputLength) + MAX_MATCH + 1;
                PairsArray      = AllocatePtr( maxPairs * (ulong)sizeof(PairInfo));
                if ( PairsArray == NIL )
                        return( memFullErr );
        } if ( DLT == NIL )
        {
                DLT     = (void *)AllocatePtr( 65536L * (ulong)sizeof(DLT[0]) );
                if ( DLT == NIL )
                {
                        FreePtr( PairsArray );
                        PairsArray      = NIL;
                        return( memFullErr );
                }
        } return( noErr );
} static OSErr
PairsSortInitCompression(Boolean compressing)
{
        if ( compressing )
                return( PairsSortInitSizeCompression( PAIRS_MAX_BLOCK_SIZE ) );
        return( noErr );
}
        static void
PairsSortDoneCompression()
{
        if ( PairsArray != NIL )
        {
                FreePtr( PairsArray );
                PairsArray      = NIL;
        } if ( DLT != NIL )
        {
                FreePtr( DLT );
                DLT     = NIL;
        }
} static void
ClearDLT()
{
        if ( DLT == NIL )
                return;
```

```
                /* clear all entries to INVALID */
    asm
    {
            move.l   #((65536L * (ulong)sizeof(DLT[0]))/32L)-1, D0
            move.l   DLT, A0
            move.l   #INVALID_LONG, D1
    @0
            move.l   D1, (A0)+
            move.l   D1, (A0)+
            move.l   D1, (A0)+
            move.l   D1, (A0)+ move.l   D1, (A0)+
            move.l   D1, (A0)+
            move.l   D1, (A0)+
            move.l   D1, (A0)+ dbra     D0, @0
    }
} static void
MatchBestPair(
            uchar              *inputData,
            OffsetType         curOffset,
            register PairInfo  *curPair,
            register uchar     *nextCharToMatch,
            OffsetType         *offset,
            ushort             *length)
{
            register OffsetType   bestOffset;
            register ulong        bestLength;  /* ulong, because assembly uses it */
            register OffsetType   minOffsetToStartMatch;
            PairInfo              *prevPair;

bestOffset    = curPair->offset;
            bestLength    = 2;

minOffsetToStartMatch = 0;
            if ( curOffset >= PAIRS_HISTORY_LENGTH )
               minOffsetToStartMatch = curOffset - (PAIRS_HISTORY_LENGTH-1);

if ( bestOffset + 1 == curOffset )
               /* too close...will cause overlap */
            {
                    if ( curPair->nextIndex == INVALID )
                    {
                            *length = 0;
                            return;
                    }
                    prevPair = curPair;
                    curPair  = &PairsArray[curPair->nextIndex];
bestOffset      = curPair->offset;
                    if ( bestOffset < minOffsetToStartMatch )
                            /* remove from list; out of range */
                    {
                            prevPair->nextIndex = INVALID;
                            *length = 0;
                            return;
                    }
```

```
}
else if ( bestOffset < minOffsetToStartMatch )
{
        *length = 1;    /* special result to reset DLT; first pair out of range */
        return;
} while ( 1 )
{
        register ulong   matchLength;
        register ulong   curPairOffset;

curPairOffset   = 0;
loopStart:
        asm
        {
        MOVEPAIR       (curPair), curPairOffset
        move.l         inputData, A1
        adda.l         curPairOffset, A1
                       ;; matchAt = inputData + curPairOffset ;; reject string right away if byte that would make it longer string does not match
        move.b   -2(nextCharToMatch,bestLength.l), D0
        cmp.b    0(A1,bestLength.l), D0
        bne              @reject move.l   nextCharToMatch, A0
        addq.l   #2, A1                 ;; matchAt += 2
        move.l   A1, D1                 ;; save for use below
;; unroll a loop to match up to 18 bytes
        cmpm.b (A0)+, (A1)+
        bne      @doneMatch
        cmpm.b (A0)+, (A1)+
        bne      @doneMatch
        cmpm.b (A0)+, (A1)+
        bne      @doneMatch
        cmpm.b (A0)+, (A1)+
        bne      @doneMatch             /* 4 compares */ cmpm.b (A0)+, (A1)+
        bne      @doneMatch
        cmpm.b (A0)+, (A1)+
        bne      @doneMatch
        cmpm.b (A0)+, (A1)+
        bne      @doneMatch
        cmpm.b (A0)+, (A1)+
        bne      @doneMatch             /* 8 compares */ cmpm.b (A0)+, (A1)+
        bne      @doneMatch
        cmpm.b (A0)+, (A1)+
        bne      @doneMatch
        cmpm.b (A0)+, (A1)+
        bne      @doneMatch
        cmpm.b (A0)+, (A1)+
        bne      @doneMatch             /* 12 compares */ cmpm.b (A0)+, (A1)+
        bne      @doneMatch
        cmpm.b (A0)+, (A1)+
        bne      @doneMatch
        cmpm.b (A0)+, (A1)+
        bne      @doneMatch
        cmpm.b (A0)+, (A1)+
```

```
                bne         @doneMatch          /* 16 compares */ cmpm.b      (A0)+, (A1)+
                bne         @doneMatch
                cmpm.b      (A0)+, (A1)+
                bne         @doneMatch          /* 18 compares */             ;;
;; at this point, a match of length 20 has been found (2 original) + 18
                addq.l      #1, A1              ;; because match succeed
doneMatch:
                move.l      A1, matchLength
                sub.l       D1, matchLength     ;; D1, contains where we started matching
                addq.w      #1, matchLength     ;; add two for first two chars, subtract one for
                                                   going too far
        } if ( matchLength > bestLength )
                /*
                ** matches we've already found with the same length are more desirable
                ** because they are closer to the current location.
                */
        {
                /* check to see if we matched past where we started */
                if (curPairOffset + matchLength > curOffset)
                {
                        matchLength     = curOffset - curPairOffset;
                        if ( matchLength > bestLength )
                           goto itsBest;
                }
                else
                {
                itsBest:
                        bestOffset      = curPairOffset;
                        bestLength      = matchLength;

if ( bestLength == MAX_MATCH )
                        {
                                /* can't match anything longer than this */
                                break;
                        }
                }

}
        reject:
#ifdef USE_ASM
                asm
                {
                        moveq           #0, D1
                        MOVEPAIR        OFFSET(PairInfo,nextIndex)(curPair), D1
                        CMPPAIR         #INVALID, D1
                        beq             @done move.l          curPair, A1
                        move.l          PairsArray, curPair
                        lsl.l           #PAIR_SIZE_BITS, D1
                        adda.l          D1, curPair CMPPAIR         (curPair), minOffsetToStartMatch
                        bls             @loopStart
                        MOVEPAIR        #INVALID, OFFSET(PairInfo,nextIndex)(A1)
                        bra             @done
                }
else
                if ( curPair->nextIndex == INVALID )
                        break;      /* no more pairs */
```

```
                        prevPair = curPair;
                        curPair  = &PairsArray[curPair->nextIndex];
                        if ( curPair->offset < minOffsetToStartMatch )
                        {
                                prevPair->nextIndex = INVALID;
                                break;
                        }
#endif
            } done:
            *length  = bestLength;
            *offset  = bestOffset;
            return;
} static OSErr
CompressBlock(
            uchar    *inputData,
            ulong    inputLength,
            uchar    *outputData,
            Boolean have68020,
            ulong    *maxDeltaPtr)
{
            register uchar    *cur;
            uchar             *last;
            PairsBlockHeader *header;
            ulong             outBitsUsed;
            uchar             *outputCur;
            register PairInfo *nextAvailPair;
            OffsetType        nextAvailPairIndex;
            ulong             maxDelta;

if ( inputLength == 0 )
                    return( noErr );

if ( PairsArray == NIL || DLT == NIL)
            {
                    return( memFullErr );
            }

/* First, output a header */
            header     = (void *)outputData;
            Nullify( (void *)header, sizeof(*header));
            header->expSize = inputLength;
            outputData     += sizeof(*header);

outputCur  = outputData;
            *outputCur = 0;

/*
            ** NOTE: on 68020 machines, outBitsUsed will be just that.
            ** on 68000, outBitsUsed is the number of bits used in
            ** the current output byte (0-7)
            */
            outBitsUsed        = 0;
            ClearDLT();

cur                = inputData;
            last               = inputData + inputLength - 1;
            nextAvailPair      = &PairsArray[0];
            nextAvailPairIndex = 0;
```

```
                maxDelta           = 0;
                while ( cur < = last )
                {
                        register ulong      vector;
                        register ulong      vectorNumBits;
                        register ushort     length;
                        ushort              tempLength;
                        OffsetType          offset;
                        register ushort     pair;
                        union
                        {
                                uchar       bytes[4];
                                ulong       along;
                        } bits;
                        ushort              totalBits;
                        OffsetType          curOffset;
                        uchar               *tempPtr;
                        OffsetType          dltVal;

curOffset          = cur - inputData;

/* get the next pair */
                        vector   = *cur++;
                        pair     = vector << 8;
                        pair     | = *cur;

dltVal   = DLT[pair];
                        if ( dltVal = = INVALID )
                                goto literal;
                        /* begin match two characters past where we started */
MatchBestPair( inputData, curOffset, &PairsArray[dltVal], cur + 1, &offset, &tempLength);
                        length   = tempLength;
                        if ( length = = 1 )
                        {
                                dltVal              = INVALID;
                                goto literal;
                        }

/*
                        ** !!! Code from here on taken from PairsCompress.c
                        */
                        if ( length = = 0)
                                /* output a literal */
                        {
                        literal:
                                vectorNumBits       = 1 + 8;

/* update DLT to point to this pair (using index into PairsArray) */
                        DLT[pair]   = nextAvailPairIndex;

/* this entry points to the previous one via an index into PairsArray */
                        nextAvailPair->offset       = curOffset;
                        nextAvailPair->nextIndex    = dltVal; /* 'next' is index of pair in PairsArray */
                        + +nextAvailPair;
                        + +nextAvailPairIndex;

}
else
                        /* output a vector */
{
                        register ulong     backOffset;

/*
                        ** Output a 10<offset> to indicate <stringmatch><offset kind><offset>
                        */
```

```
backOffset  = curOffset - offset;

if ( backOffset < = BACK_BITS_MAX )
{
        /* 0 bit indicated an 8 bit backwards offset */
        vector   = backOffset;
        vector   | = 2L < < BACK_BITS;   /* xxx10 < < BACK_BITS */
        vectorNumBits   = 1 + 1 + BACK_BITS;
}
else
        /* output 11<offset> */
{
        /* 1 bit indicates an PAIRS_HISTORY_BITS bit backwards offset */
        vector   = backOffset;
        vector   | = 3 < < PAIRS_HISTORY_BITS;
        vectorNumBits   = 1 + 1 + PAIRS_HISTORY_BITS;
}

/*
** at this point, we have 13 bits of data; a 0 bit to indicate a match,
** followed by a PAIRS_HISTORY_BITS bit offset. (the 0 bit was cleared
** when we set the vector).
** Add another bit now to say "2-byte code" or "larger code".
*/
if ( length = = 2 )
{
/* low order bit stays 0 to indicate 2 byte code */
        vector    < < = 1;  /* shift a zero into the low order bit */
        + +vectorNumBits;
}
else if ( length < = 4)
                /* length is 3 or 4 */
                {
                vectorNumBits   + = 3;
                vector          < < = 3;
                vector          | = 4;    /* low order 3 bits: 10x */
                vector          | = length - 3;   /* 0 or 1 */
}
else
        /* length is [5,MAX_MATCH] 11xxxx*/

{
vectorNumBits   + = 2 + MAX_MATCH_BITS;
/* add continuation bits */
vector            < < = 2 + MAX_MATCH_BITS;
vector            | = 3 < < MAX_MATCH_BITS;
/* low order 2 + MAX_MATCH_BITS bits: 11xxx */
vector            | = length - 5;
}
/*
** Now add pairs for each one in the string that was matched
** except for first pair, which is added below.
*/
--cur;    /* cur is one past current position */
#ifdef USE_ASM
  asm
{
        lea      -1(cur,length.w),A1      ;; get tempPtr
        moveq    #0, D0
        moveq    #0, D2
        MOVEPAIR    nextAvailPairIndex, D2
        MOVEPAIR    curOffset, D0
@0:
        moveq  #0,D1
        move.b (cur)+, D1
```

```
            lsl.l    #8, D1
            move.b  (cur), D1

MOVEPAIR  D0, (nextAvailPair)  ;; nextAvailPair->offset = curOffset;

add.l    D1, D1
#ifdef BIG_PAIRS
            add.l    D1, D1
endif move.l   DLT, A0
            add.l    D1, A0    ;; now have &DLT[pair]

MOVEPAIR (A0), OFFSET(PairInfo,nextIndex)(nextAvailPair)
                    ;; nextAvailPair->nextIndex = DLT[pair]
            addq.l   #sizeof(PairInfo), nextAvailPair    ;; ++nextAvailPair
            MOVEPAIR D2, (A0)  ;;DLT[pair] = nextAvailPairIndex
                    addq.l   #1, D0
                    addq.l   #1, D2 cmpa.l   A1, cur
                    bls      @0
                    MOVEPAIR D2, nextAvailPairIndex
                    MOVEPAIR D0, curOffset
}
#else USE_ASM
            tempPtr = cur + length -1;
            while ( cur <= tempPtr )
{
            pair     = *cur << 8;
            ++cur;
            pair     |= *cur;

nextAvailPair->offset     = curOffset;
            nextAvailPair->nextIndex  = DLT[pair];
            DLT[pair]                 = nextAvailPairIndex;
            ++nextAvailPair;
            ++nextAvailPairIndex;
            ++curOffset;
        }
        #endif USE_ASM if ( maxDeltaPtr != NIL )
/*
** It's not necessary to look for max delta for literals
** because it can only decrease for literals
*/
{
            ulong   curCompressed;

if ( have68020 )
                    curCompressed = outBitsUsed / 8;
            else
                    curCompressed = outputCur - outputData;
                    ++curCompressed;       /* account for odd bits */ if ( curCompressed < curOffset )
                            /* have we saved anything yet? */
            {
                    ulong   tempDelta;
                    tempDelta    = curOffset - curCompressed;
                    if ( tempDelta > maxDelta )
                    maxDelta     = tempDelta;
            }
```

```
            }
        }
putBits:
        if ( have68020 )
        {
        #pragma options (mc68020)
          asm
          {
                move.l  outputData, A0
                move.l  outBitsUsed, D0
                bfins   vector, (A0){D0:vectorNumBits}
                add.l   vectorNumBits, outBitsUsed
          }
        #pragma       options (!mc68020)
        }
        else
        {
                bits.along  = 0;
                totalBits   = vectorNumBits + outBitsUsed;
                vector    <<= 32 - totalBits;       /* assume 32 bits in a long */ bits.bytes[0]    = *outputCur;

bits.along       |= vector;
                *outputCur       = bits.bytes[0];
                *(outputCur + 1) = bits.bytes[1];
                *(outputCur + 2) = bits.bytes[2];
                *(outputCur + 3) = bits.bytes[3];

outputCur   += totalBits >> 3;  /* divide by 8 bits to get # bytes */
                outBitsUsed  = totalBits & 7;
        }

}
/*
** Expander can overwrite things by PAIRS_MAX_OVERWRITE bytes.
*/
if ( maxDeltaPtr != NIL )
{
        *maxDeltaPtr = maxDelta + PAIRS_MAX_OVERWRITE;
} if ( have68020 )
        /* account for fact that on 68020 outBitsUsed is all the bits, not just odd ones */
        {
        outputCur   += outBitsUsed/8;
        outBitsUsed &= 7;   /* reset to how many partial bits are left for test below */
        } header->compSize = outputCur - outputData;
        if ( outBitsUsed > 0 )
        header->compSize += 1;

header->compressorUsed = usedPairsSortCompressor;
        header->expSize        = inputLength;

/*
        ** For alignment purposes, always finish out a long word
        */
        if ( header->compSize > inputLength )
                /* if the data expanded, just copy it */
        {
                header->copied          = TRUE;
```

```
            header->compSize        = inputLength;
            /* just copy input data to output data */
            BlockMove( inputData, outputData, inputLength);
    }

/* always make compSize a multiple of 4 bytes */
    header->compSizePad    = header->compSize % 4;
    if ( header->compSizePad != 0 )
            header->compSizePad    = 4 - header->compSizePad;
    header->compSize       += header->compSizePad;

/* a checksum can be computed and stored in header->compDataChecksum, if
    desired */ return( noErr );
}
```

The above disclosure, including the computer program listing, is to be taken as illustrative of the invention, not as limiting its scope or spirit. Numerous modifications and variations will become apparent to those skilled in the art after studying the above disclosure.

By way of example, instead of using DLT 170 to locate the head of each linked-list 181, 182, etc., a nonsorted table can be provided with the name e.g. AA, AB, AC, etc. of each linked list and the address of its head record. A binary or other search through the nonsorted table (not shown) would be used to convert an index-pair code 166 into a head-of-list pointer 176. The search could be carried with software or, if speed is important, with the aid of a hardware chip that is dedicated to carrying such a search in minimal time. This DLT-less approach would be useful in cases where system RAM does not have enough free space to support a large DLT (e.g. 64K or more entries).

By way of further example, instead of using linked-lists 181, 182, etc. to locate the start of each matching old string (MOS) and to determine the relative distances and/or order of the MOS's relative to the current position 163a, other data structures which provide the substantially the same function could be used. One possibility would be a set of files (e.g. circular buffer files) with expansion room being provided in each file for adding new records into the file. The new records are added to point to the start of each newly encountered string 163 as the current pointer 165 advances and the just encountered string 163 becomes a potentially-matching old string (MOS) for the next, subsequently processed string 164.

Given the above disclosure of general concepts and specific embodiments, the scope of protection sought is to be defined by the claims appended hereto.

What is claimed is:

1. An apparatus, operatively couplable to a pre-specified, responsive data processing machine, for defining and conveying instructions to the data processing machine upon coupling therewith, where said machine includes memory means for storing data in identifiable locations thereof; said couplable instruction defining and conveyance apparatus comprising:

a plurality of instruction means for instructing the data processing machine to perform operations, the plurality of instruction means including:

(a) first means for instructing said machine to specify as current, a particular location within the memory means;

(b) second means for instructing said machine to allocate space within the memory means for storing one or more historical data strings; and (c) third means for instructing said machine to create within the memory means, a fast-path portion storing groups of one or more history pointers, where each group is dedicated to a respective one of a prespecified plurality of unique code sequences and the one or more history pointers of that group respectively point to and identify a corresponding one or more locations within the memory means that store one or more of the historical data strings, if any, which contain the respective one of the prespecified plurality of unique code sequences to which the corresponding group is dedicated and, in cases where more than one of the identified historical data strings has the same prespecified sequence of code, for arranging the history pointers of the corresponding group to indicate the positional order of the more than one identified historical data strings relative to the current location so that it can be quickly determined from said arrangement of the history pointers whether a first history location that stores a corresponding first of the identified historical data strings is address-wise closer to or further from the current location than is a second history location that stores a corresponding second of the identified historical data strings.

2. An instruction defining and conveyance apparatus according to claim 1 further comprising a recording medium, wherein said plurality of instruction means are defined as instructional signals recorded on the recording medium.

3. An instruction defining and conveyance apparatus according to claim 2 wherein the recording medium is selected from the group consisting of: a magnetically-encoded disk, an optically-encoded disk, a magnetic tape, and a read-only memory device.

4. An apparatus according to claim 2 further comprising instruction signal conveying means, engageable with the plurality of instruction means and couplable to the instructable data processing machine, for supplying instructions to the instructable data processing machine as electrical or optical signals.

5. An apparatus according to claim 4 wherein the instruction signal conveying means includes means selected from the group consisting of: a disk drive, a tape drive and a ROM cartridge reader.

6. An apparatus for storing and conveying data to a pre-specified, data processing machine, where said data storage and conveyance apparatus has physical attributes organized to represent data to be conveyed to the data processing machine and the to-be-conveyed data includes a plurality of vectors each generated by the following data processing method:

(a) storing a plurality of data strings within memory;

(b) identifying one or more of the data strings that start with a prespecified code sequence;

(c) in cases where more than one of the identified data strings has the same prespecified sequence of code, indicating the relative positional order of the more than one identified data strings within the memory;

wherein said steps of (b) identifying one or more of the data strings and (c) indicating the relative positional order, include:

(b.1) identifying a position within said memory as a current position; and (c.1) creating a fast-path array in said memory where the fast-path array includes one or more lists each associated with a unique prespecified code sequence; where each list contains a head record pointing to an instance of its associated unique code sequence which is closest to the current position;

said method further comprising the steps of:

(d) supplying a current data string having at least first and second codes and using the first and second current data string codes to specify an index-pair code;

(e) converting the index-pair code into a head-record pointer that points to a corresponding head record within the fast-path array;

(f) using the corresponding head record to locate the instance of the associated unique code sequence which is closest to the current position; and generating a vector representing an offset from the current location to the located instance of the associated unique code sequence.

7. A data storage and conveyance apparatus according to claim 6 wherein, for the underlying vector generating method, the step (f) of using the corresponding head record to locate the instance of the associated unique code sequence which is closest to the current position is followed by the step of:

(f.1) using the corresponding head record and/or subsequent records following the head record to locate within the memory one or more instances of the associated unique code sequence which first match the current string to a maximum extent and thereafter, if two or more such maximum-extent instances are located, to locate the that maximum-extent instance which is closest to the current position.

8. A data storage and conveyance apparatus according to claim 7 wherein the generated vector is a compression vector for replacing the matched current string, the generated compression vector consists of fewer bits than that portion of the current string which it replaces and said data processing method is part of a data compression method that generates plural compression vectors.

* * * * *

UNITED STATES PATENT AND TRADEMARK OFFICE
CERTIFICATE OF CORRECTION

PATENT NO. : 5,577,248
DATED : November 19, 1996
INVENTOR(S) : Lloyd L. Chambers, IV It is certified that error appears in the above-indentified patent and that said Letters Patent is hereby corrected as shown below:

Column 3, line 3 of TABLE 1 should be
--THE_CAT_SAT_IN_A_SATIN_HAT_THAT_A_MAN_CANNOT_WEAR.--

Signed and Sealed this

Twenty-fifth Day of February, 1997

Attest:

BRUCE LEHMAN

*Attesting Officer*     *Commissioner of Patents and Trademarks*